United States Patent [19]

Ebert, Jr.

[11] 4,208,627
[45] Jun. 17, 1980

[54] ALARM CIRCUIT TO DETECT SHORTING OF PERIODIC SIGNAL SOURCE

[75] Inventor: Harry K. Ebert, Jr., Hackettstown, N.J.

[73] Assignee: Bell Telephone Laboratories, Incorporated, Murray Hill, N.J.

[21] Appl. No.: 953,443

[22] Filed: Oct. 23, 1978

[51] Int. Cl.² .................... G01R 19/00; G01R 31/02; G08B 21/00
[52] U.S. Cl. .................................. 324/102; 324/51; 324/133; 340/650; 340/663
[58] Field of Search .................... 324/102, 133, 51; 340/663, 650, 651; 361/92, 187

[56] References Cited

U.S. PATENT DOCUMENTS

| 3,184,729 | 5/1965 | Freedman et al. | 340/663 |
| 3,774,109 | 11/1973 | Janycky | 340/663 |
| 3,937,937 | 2/1976 | McVey | 324/51 |

Primary Examiner—Rudolph V. Rolinec
Assistant Examiner—Ernest F. Karlsen
Attorney, Agent, or Firm—Alfred G. Steinmetz

[57] ABSTRACT

An alarm circuit to monitor a periodic signal source for an occurrence of a short-circuit condition detects the entry of the instantaneous periodic signal magnitude into a predefined window bounded by an upper and lower threshold. The duration of the entry is timed to determine if a short circuit has occurred.

3 Claims, 2 Drawing Figures

ALARM CIRCUIT TO DETECT SHORTING OF PERIODIC SIGNAL SOURCE

TECHNICAL FIELD

This invention is concerned with signal monitoring apparatus and the circuitry to respond to a shorting of the monitored signal. In particular, it is concerned with a high speed method of detecting the shorting of a periodic signal.

BACKGROUND OF THE INVENTION

Signal monitoring circuits are used in many applications involving the protection of circuitry and the control of circuit functions. A specific signal monitoring application requiring a rapid response of the monitoring apparatus is the field of uninterruptible power supplies where two power sources are coupled to a power control unit which supplies a continuous power output irrespective of the failure of one or the other power sources. In general, the power supply power output depends basically on a commercial AC power source which operates continuously and a secondary power source is held in reserve to become operative and supply power upon the failure of the basic commercial AC power source. In order to maintain the power output truly continuous, the failure of the commercial power source must be ascertained rapidly so that the secondary or reserve source may be promptly switched to supply the output power.

One of the signal failures of the commercial power source which must be monitored is the occurrence of short circuits which rapidly drop the voltage to zero. Conventional short circuit detectors normally operate by monitoring either the average of the input signal or the periodic attainment of a minimum threshold signal magnitude. Both of these methods are limited in the rapidity of their response. Averaging is time consuming and the detection of a threshold requires that the monitoring circuitry take into account the periodic time interval necessary to periodically obtain that threshold. This periodic time is normally a substantial part of the periodic cycle and hence limits the speed of response of the monitoring circuitry. A simple instantaneous failure check of the magnitude of a periodic signal being monitored is not suitable for activating such a monitoring circuit since in the typical commercial periodic signal a zero crossing occurs twice in each cycle.

SUMMARY OF THE INVENTION

Therefore, in accord with the principles of the invention, a rapid detection of the shorting of a periodic signal operates on the principle that in a periodic waveform a small portion of the waveform is indicative of the conditions of the entire waveform. The known behavior of the periodic curve within any magnitude range is compared with the actual behavior of the curve to determine if indeed the signal exists or has been shorted.

In general, a small portion of a periodic signal waveform is monitored for a short time interval at its zero crossing occurrence to determine the state of the signal. Threshold circuits determine the existence of a zero crossing and timing circuits monitor the behavior of the signal in the vicinity of the zero crossing to determine if the waveform is normal or whether a short circuit has occurred.

In a particular embodiment the monitoring circuit monitors each zero crossing by establishing a magnitude range or window about this occurrence and determining if the signal magnitude remains between the threshold levels of the magnitude range beyond a short predetermined time interval. Shorting of the AC signal is clearly indicated if the magnitude stays within the threshold limits, or window, for longer than a predetermined interval.

BRIEF DESCRIPTION OF THE DRAWING

The principles of the invention may be readily ascertained through reading the description of a circuit embodying the principles of the invention which is discussed hereinbelow and disclosed in the accompanying drawings wherein.

DETAILED DESCRIPTION

Figure 1:
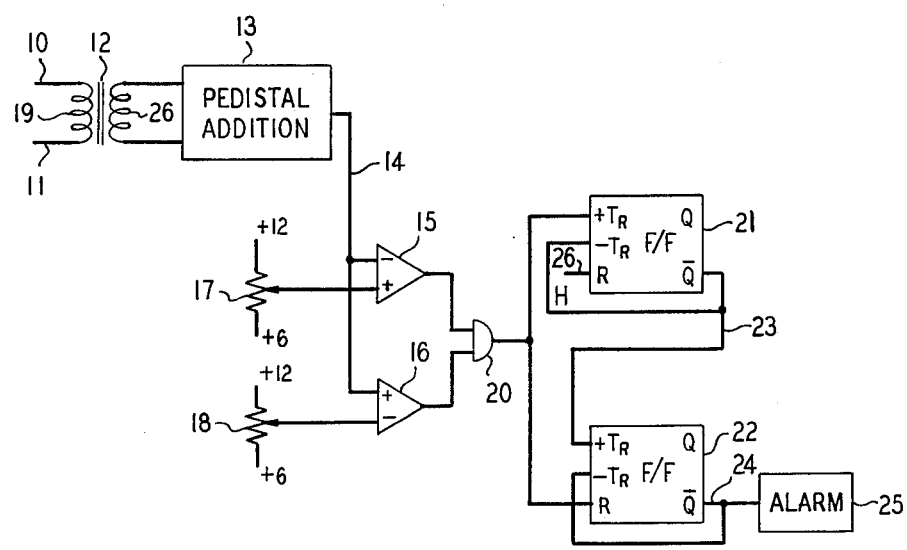
FIG. 1 is a block and schematic of an alarm circuit embodying the principles of the invention.

A monitoring circuit embodying the principles of the invention is shown in FIG. 1. It includes a sensing circuit coupled at input leads 10 and 11 to monitor a periodic signal. This sensing circuit, as shown, comprises a transformer 12 coupled to the periodic signal to provide isolation.

Figure 2:
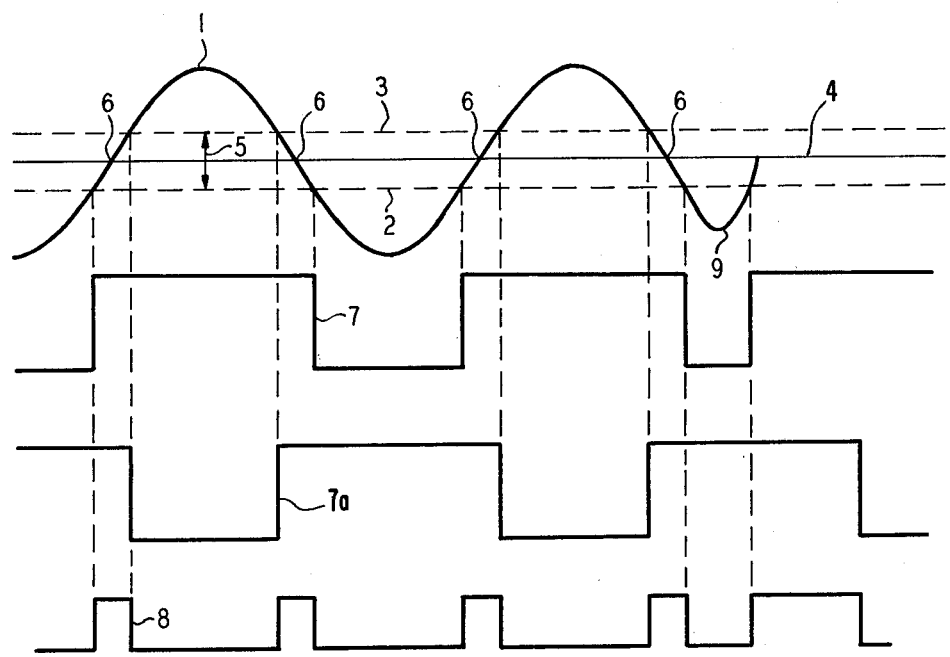
FIG. 2 discloses voltage waveforms to assist in explaining the operation of the circuit disclosed in FIG. 1.

The periodic signal being monitored may comprise a periodic sine-wave signal such as shown by waveform 1 in FIG. 2; however, it is to be understood that other similar continuous periodic signals may be monitored.

The monitored AC signal is applied to a pedestal addition circuit 13 which adds a DC level to the AC periodic signal. The techniques of adding DC level to periodic signals are well known and it is not believed necessary to disclose this circuit in detail.

The periodic signal with the added DC level is applied via lead 14 to the inverting and noninverting inputs of the first and second operational comparator amplifiers 15 and 16, respectively. Predetermined threshold voltages as determined by the voltage energized potentiometers 17 and 18 are applied to the noninverting and inverting inputs of the first and second operational amplifiers 15 and 16, respectively. Potentiometer 17 is adjusted to define a lower threshold reference value and potentiometer 18 is adjusted to define a higher threshold reference value as shown by levels 2 and 3, respectively, in FIG. 2.

The outputs of the first and second operational comparator amplifiers 15 and 16 are applied to an AND gate 20 whose output in turn is applied in parallel to the positive trigger of a first monostable multivibrator 21 and to the reset or enable input of a second monostable multivibrator 22. Monostable multivibrators 21 and 22 are coupled in a cooperative fashion so that the output of multivibrator 21 can trigger multivibrator 22 if certain input conditions are met. Output 23 of the first monostable multivibrator 21 is coupled to the positive trigger input of the second monostable multivibrator 22. Complementary output 24 of the second monostable multivibrator 22 is applied to an alarm response circuit 25 which may comprise switching circuitry to bring about desired changes in the control circuitry of the uninterruptible power supply to substitute a reserve signal for the shorted periodic signal.

The principles of the invention may be readily understood by describing the operation of the circuit in FIG.

1 in detecting the shorting of the periodic signal source. An AC signal, shown by waveform 1 in FIG. 2, is sensed by the transformer 12 and applied by secondary winding 26 to a pedestal addition circuit 13 which places the periodic AC sinusoidal waveform 1 on a DC level 4 as shown in FIG. 2. In the example herein, the AC waveform 1 may be considered to have a peak-to-peak voltage of 117 volts and the DC level has a value of 5 volts. The output signal of the pedestal addition circuit 13 is applied via lead 14 to the inverting and noninverting inputs of the two operational amplifier comparators 15 and 16, respectively, shown by level 4 in FIG. 2. Two reference voltages supplied by the potentiometers 17 and 18 are respectively preset at slightly less and slightly more than the 5 volt level applied to the AC waveform.

These thresholds, shown by levels 2 and 3 in FIG. 2, define a window 5 about the actual zero crossing points 6 of the periodic signal 1. Within this window 5 the signal must enter and leave within a predetermined time interval, otherwise a short-circuit condition has occurred. The periodic AC signal 1 must not remain within the window 5 beyond a predetermined time interval defined by timing circuits as described below.

It is apparent to those skilled in the art that when the periodic AC signal is within the window 5 the outputs of the first and second operational amplifiers 15 and 16 are both high. Should the signal be above the upper threshold level 3 or below the lower threshold level 2, the output state of one or the other of the operational amplifier comparators is at a low value.

The outputs of the amplifiers 15 and 16 are applied to the AND gate 20 whose output in turn is coupled to a positive trigger input of the first monostable multivibrator and into the reset enable of the second monostable multivibrator. The outputs of the first and second operational amplifiers 15 and 16 are shown respectively by the two waveforms 7a and 7 in FIG. 2. These two output signals 7a and 7 are both applied to the AND gate 20. If both input signals are high the output of the AND gate 20 is high as shown by the waveform 8 in FIG. 2.

It is apparent that the output state of the AND gate 20 shown by the pulse of waveform 8 is high as long as the waveform 1 is within the window 5. This pulse output 8 of the AND gate 20 is coupled to the positive trigger of the first monostable multivibrator 21 and to the reset enable input of the second monostable multivibrator 22. The occurrence of a high state at the output of the AND gate triggers the first monostable multivibrator 21 and its output on lead 23 goes high. The high state output of AND gate 20 also enables the monostable multivibrator 22 due to the low state signal on lead 23 multivibrator 22 is not triggered so its complementary output on lead 24 remains high. The first monostable multivibrator 21 is continuously enabled by a high input applied to its enable reset input 26 while the second multivibrator is enabled only when the AND gate output is high. It is apparent from the foregoing that when the periodic signal waveform 1 enters the window 5 the continuously enabled multivibrator 21 is triggered and its output on lead 23 is a low signal state and does not yet trigger the enabled multivibrator 22 whose output to the alarm circuit remains at a high state.

Under normal operating conditions the waveform 1 quickly leaves the window 5 and the output of AND gate 20 goes low. At the end of its internally timed interval the multivibrator 21 changes state and its output on lead 23 goes high. The enabling high signal is removed from multivibrator 22 when waveform 1 leaves the window 5 and its complementary output on lead 24 remains high since the trigger signal on lead 23 occurs after the enabling signal is removed. Hence the alarm circuit 25 remains unactivated.

Should a short circuit occur, such as shown at point 9 of the waveform 1 in FIG. 2, the magnitude of the periodic waveform drops to a zero level and enters the window 5. Waveforms 7a and 7, representing the outputs of operational amplifier comparators 15 and 16, both go high thereby enabling the AND gate 20. As in the previous example, the high output of the AND gate 20 triggers the monostable multivibrator 21. The second monostable multivibrator 22 is enabled, as before, by the high input to its reset enable input and, in response to the low state its output on lead 24 remains high. At the end of the predetermined timed interval determined by the internal timing of the first monostable multivibrator 21, the output on lead 23 of the first monostable multivibrator 22 goes high. The multivibrator 22 is still enabled by the high output state of the AND gate 20 and stays in this condition due to continued existence of waveform 1 within the window 5. At the end of this internally timed interval, the complementary output of multivibrator 21 on lead 23 goes high, triggering the multivibrator 22. The resulting low signal output on lead 24 activates alarm 25 indicating the existence of a short circuit.

What is claimed is:

1. A short-circuit detector for a periodic signal source comprising:
    reference means for establishing an upper and lower magnitude limit;
    monitoring means coupled to the reference means and operative for monitoring a periodic signal of said signal source and generating a first pulse signal having a pulse duration equal to a time interval of the presence of the periodic signal between the upper and lower magnitude limit;
    a first timing circuit responsive to the first pulse signal generated by the monitoring means and operative to generate a second pulse signal having a time duration slightly exceeding a desired time interval of the presence of the periodic signal between the upper and lower magnitude limit; and
    a second timing circuit coupled to be enabled by the first pulse signal and to respond to a termination of the second pulse signal when enabled in order to activate an alarm.

2. A short-circuit detector as defined in claim 1 wherein said monitoring means includes first and second comparator circuits and a coincidence gate responsive to outputs of said first and second comparator circuits.

3. A short-circuit detector for a periodic signal source comprising:
    signal amplitude detection means for detecting an entry of an instantaneous magnitude of a periodic signal of said periodic signal source between a predetermined upper and lower threshold magnitude and generating a first pulse signal in response thereto having a duration equal to a time interval of a presence of the instantaneous magnitude of the periodic signal between the upper and lower threshold magnitude;
    a first monostable circuit responsive to be triggered by the first pulse signal output of the signal amplitude detection means and operative to generate a second pulse signal having a predetermined time duration slightly exceeding a desired time interval of a presence of the instantaneous magnitude of the periodic signal between the upper and lower threshold magnitude;

a second monostable circuit coupled to be enabled by the first pulse signal and further coupled to said first monostable circuit to be triggered in response to a termination of the second pulse signal indicating a resetting of the first monostable circuit; and an alarm means to indicate a response of the second monostable circuit to a termination of the second pulse signal.

* * * * *